(12) United States Patent
Ishikawa et al.

(10) Patent No.: US 8,073,660 B2
(45) Date of Patent: Dec. 6, 2011

(54) ANALYZING MODEL CREATING APPARATUS AND METHOD, AND COMPUTER-READABLE STORAGE MEDIUM TO CREATE A MODEL USING A MINIMUM PART INTERVAL BETWEEN PARTS

(75) Inventors: Shigeo Ishikawa, Kawasaki (JP); Kanako Imai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 601 days.

(21) Appl. No.: 12/222,728

(22) Filed: Aug. 14, 2008

(65) Prior Publication Data
US 2009/0157373 A1 Jun. 18, 2009

(30) Foreign Application Priority Data
Dec. 14, 2007 (JP) .................. 2007-323689

(51) Int. Cl.
G06F 7/60 (2006.01)
G06F 17/10 (2006.01)
G06F 17/50 (2006.01)
(52) U.S. Cl. .......................... 703/2; 716/106
(58) Field of Classification Search ....... 703/2; 716/106
See application file for complete search history.

(56) References Cited

U.S. PATENT DOCUMENTS

| | | | | |
|---|---|---|---|---|
| 5,579,249 A | * | 11/1996 | Edwards ........................... | 703/2 |
| 6,064,810 A | * | 5/2000 | Raad et al. ...................... | 703/23 |
| 7,228,519 B2 | * | 6/2007 | Aoki et al. ...................... | 716/50 |
| 2003/0083856 A1 | * | 5/2003 | Yoshimura et al. ............. | 703/18 |
| 2006/0231622 A1 | * | 10/2006 | Kieffer et al. .................. | 235/449 |
| 2006/0294436 A1 | | 12/2006 | Sakai | |
| 2007/0088536 A1 | | 4/2007 | Ishikawa | |
| 2007/0233436 A1 | | 10/2007 | Ishikawa | |

FOREIGN PATENT DOCUMENTS
JP 2005-115859 4/2005
JP 2006-91939 4/2006

OTHER PUBLICATIONS

European Search Report dated Aug. 19, 2009 and issued in corresponding European Patent Application 08162436.3.
European Search Report dated Aug. 19, 2009 and issued in corresponding European Patent Application 08162436.3

* cited by examiner

*Primary Examiner* — Dwin M Craig
(74) *Attorney, Agent, or Firm* — Staas & Halsey LLP

(57) ABSTRACT

An analyzing model creating apparatus includes an interval acquiring part to acquire intervals of a plurality of parts that are mounted on a PCB for an electronic equipment, from design data of the PCB, a comparing part to compare a minimum part interval between the parts and a first mesh size which is preset, and a computing part to compute a value which is ½ the minimum part interval between the parts as a second mesh size if the minimum part interval between the parts is less than 2 times the first mesh size. A generating part is provided to generate an analyzing model of the printed circuit board based on the second mesh size.

15 Claims, 15 Drawing Sheets

(a)

(b)

ANALYZING MODEL CREATING APPARATUS AND METHOD, AND COMPUTER-READABLE STORAGE MEDIUM TO CREATE A MODEL USING A MINIMUM PART INTERVAL BETWEEN PARTS

BACKGROUND OF THE INVENTION

1. Field of the Invention

The present invention generally relates to analyzing model creating apparatuses and methods and computer-readable storage media, and more particularly to an analyzing model creating apparatus and an analyzing model creating method which create a Finite Element Method (FEM) model suited for evaluating a part bonding strength of a part that is mounted on a Printed Circuit Board (PCB), and to a computer-readable storage medium which stores a program for causing a computer to realize functions of such an analyzing model creating apparatus.

2. Description of the Related Art

Recently, due to the reduced weight and size of portable electronic equipments, it is becoming increasingly important from the point of design to secure the part bonding strength of the part that is mounted on the PCB which is assembled within the portable electronic equipment. There are proposals to improve the efficiency with which the portable electronic equipments are developed, by evaluating a virtual part bonding strength by a numerical simulation using the Finite Element Method (FEM).

Because the parts mounted on the PCB of the portable electronic equipment are extremely small, an evaluation method which directly evaluates a solder bonding part by forming a detailed mesh model of the parts is unsuited in this case. For this reason, an evaluation method which is generally employed fixes rectangular part meshes of a simple part model on PCB meshes in a joining contact state, and evaluates a PCB stress or distortion in a periphery of the part in order to indirectly evaluate the load on the part. More particularly, the part and the board are respectively divided into meshes from a three-dimensional model of the PCB, and a node located on a part mounting surface is fixed to a mesh surface of the board using a joining type contact definition, in order to create a FEM model.

Three-dimensional models of the PCB are proposed in Japanese Laid-Open Patent Applications No. 2005-115859 and No. 2006-91939, for example.

Conventionally, most of the three-dimensional models of the mounting parts have a simple block shape, and it is relatively easy to create the meshes. However, because the number of meshes is large, there was a problem in that a large number of processes are required to create the meshes.

On the other hand, the division of the board into the meshes and the division of the evaluation target part into the meshes are performed independently, and the meshes of the board and the meshes of the evaluation target part are fixed using the joining type contact definition. For this reason, the size and direction (or orientation) of an evaluation target element 12 may differ depending on the position in the periphery of the evaluation target part as shown in FIG. 1. Consequently, a relative error of approximately 30%, for example, is generated in the evaluation result depending on the manner in which the PCB model is created. FIG. 1 is a diagram for explaining the conventional FEM model. In FIG. 1, (a) shows a plan view of the FEM model, and (b) shows a portion of the evaluation target part of the FEM model. In FIG. 1, a reference numeral 10 denotes a mesh model of the board, and a reference numeral 11 denotes a mesh model of the evaluation target part.

SUMMARY OF THE INVENTION

Accordingly, it is a general object of the present invention to provide, among other things, a novel and useful analyzing model creating apparatus and method and computer-readable storage medium, in which the problems described above are suppressed.

Another and more specific object of the present invention is to provide an analyzing model creating apparatus, an analyzing model creating method and a computer-readable storage medium, which can automatically and efficiently create a FEM model of a printed circuit board suited for evaluating the part bonding strength on the printed circuit board.

According to one aspect of the present invention, there is provided an analyzing model creating apparatus comprising an interval acquiring part configured to acquire intervals of a plurality of parts that are mounted on a printed circuit board for an electronic equipment, from design data of the printed circuit board; a comparing part configured to compare a minimum part interval between the parts and a first mesh size which is preset; a computing part configured to compute a value which is one-half the minimum part interval between the parts as a second mesh size if the minimum part interval between the parts is less than two times the first mesh size; and a generating part configured to generate an analyzing model of the printed circuit board based on the second mesh size.

According to one aspect of the present invention, there is provided a computer-readable storage medium storing a program which causes a computer to execute procedures comprising an interval acquiring procedure acquiring intervals of a plurality of parts that are mounted on a printed circuit board for an electronic equipment, from design data of the printed circuit board; a comparing procedure comparing a minimum part interval between the parts and a first mesh size which is preset; a computing procedure computing a value which is one-half the minimum part interval between the parts as a second mesh size if the minimum part interval between the parts is less than two times the first mesh size; and a generating procedure generating an analyzing model of the printed circuit board based on the second mesh size.

According to one aspect of the present invention, there is provided an electronic equipment comprising a printed circuit board, wherein the printed circuit board is designed and produced using an analyzing model creating apparatus comprising an interval acquiring part configured to acquire intervals of a plurality of parts that are mounted on the printed circuit board for an electronic equipment, from design data of the printed circuit board; a comparing part configured to compare a minimum part interval between the parts and a first mesh size which is preset; a computing part configured to compute a value which is one-half the minimum part interval between the parts as a second mesh size if the minimum part interval between the parts is less than two times the first mesh size; and a generating part configured to generate an analyzing model of the printed circuit board based on the second mesh size.

According to one aspect of the present invention, there is provided an analyzing model creating method to be implemented in a computer for causing the computer to execute processes comprising an interval acquiring step acquiring intervals of a plurality of parts that are mounted on a printed circuit board for an electronic equipment, from design data of the printed circuit board; a comparing step comparing a minimum part interval between the parts and a first mesh size which is preset; a computing step computing a value which is one-half the minimum part interval between the parts as a second mesh size if the minimum part interval between the parts is less than two times the first mesh size; and a generating step generating an analyzing model of the printed circuit board based on the second mesh size.

According to one aspect of the present invention, it is possible to realize an analyzing model creating apparatus, an analyzing model creating method and a computer-readable storage medium, which can automatically and efficiently create a FEM model of a PCB suited for evaluating the part bonding strength on the PCB.

Other objects and further features of the present invention will be apparent from the following detailed description when read in conjunction with the accompanying drawings.

DESCRIPTION OF THE PREFERRED EMBODIMENTS

A system in accordance with one embodiment of the present invention may include the following functions.

1) A three-dimensional model classifying function;
2) A board region dividing function;
3) A mesh creating function; and
4) A fixing function to fix a part on a board.

Figure 1:
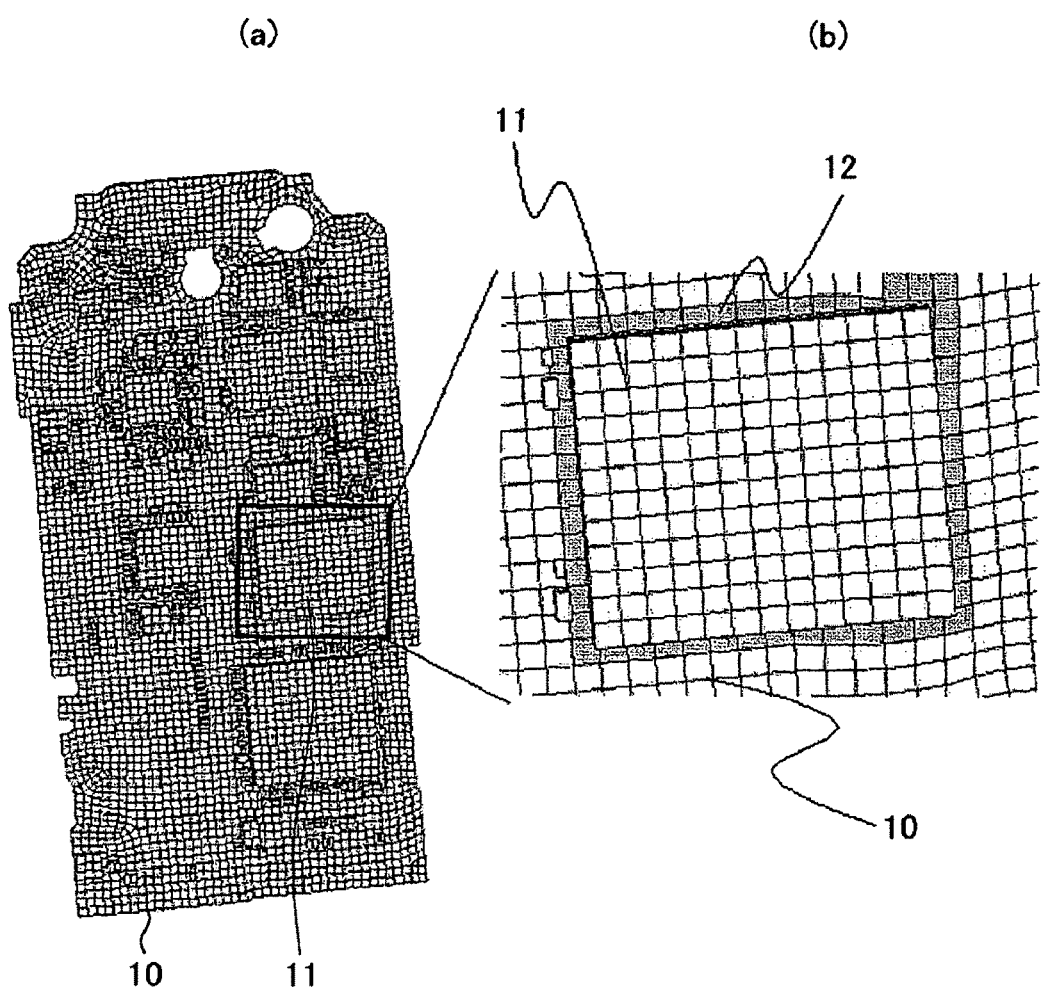
FIG. 1 is a diagram for explaining a conventional FEM model.
Figure 2:
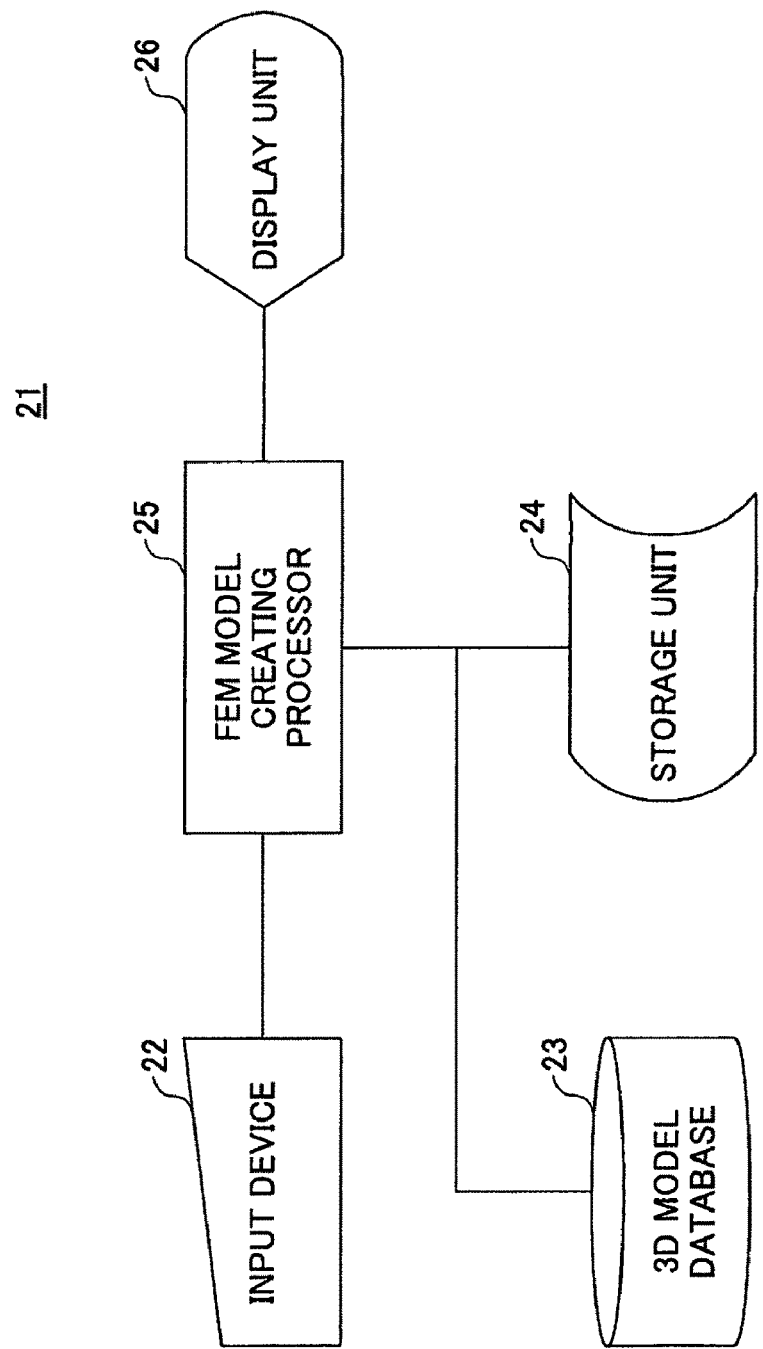
FIG. 2 is a system block diagram showing an analyzing model creating apparatus in an embodiment of the present invention.

FIG. 2 is a system block diagram showing an analyzing model creating apparatus in an embodiment of the present invention. An analyzing model creating apparatus 21 includes an input device 22 such as a keyboard, a three-dimensional (3D) model database 23, a storage unit 24, a FEM model creating processor 25, and a display unit 26 which are connected as shown in FIG. 2. The 3D model database 23 may be connected externally to the analyzing model creating apparatus 21. The storage unit 24 forms a storage region for storing various data used by the processes executed by the FEM model creating processor 25, intermediate data of operation processes executed by the FEM model creating processor 25 and the like. The storage unit 24 may include the 3D model database 23. The FEM model creating processor 25 creates a FEM model based on 3D model data read from the 3D model database 23, in response to an instruction input by a user from the input device 22, and displays the created FEM model on the display unit 26.

The analyzing model creating apparatus 21 may be formed by a general-purpose computer system which includes a processor such as a CPU and a storage unit such as a memory. In this case, the processor functions as the FEM model creating processor 25. In addition, the computer system (or processor) functions as the analyzing model creating apparatus 21 by executing an analyzing model creating program that is stored in a storage means such as the storage unit 24. The storage means which stores the program is not limited to a particular type and may be formed by any suitable computer-readable storage medium, and the storage means may be formed by a portable storage medium.

Figure 3:
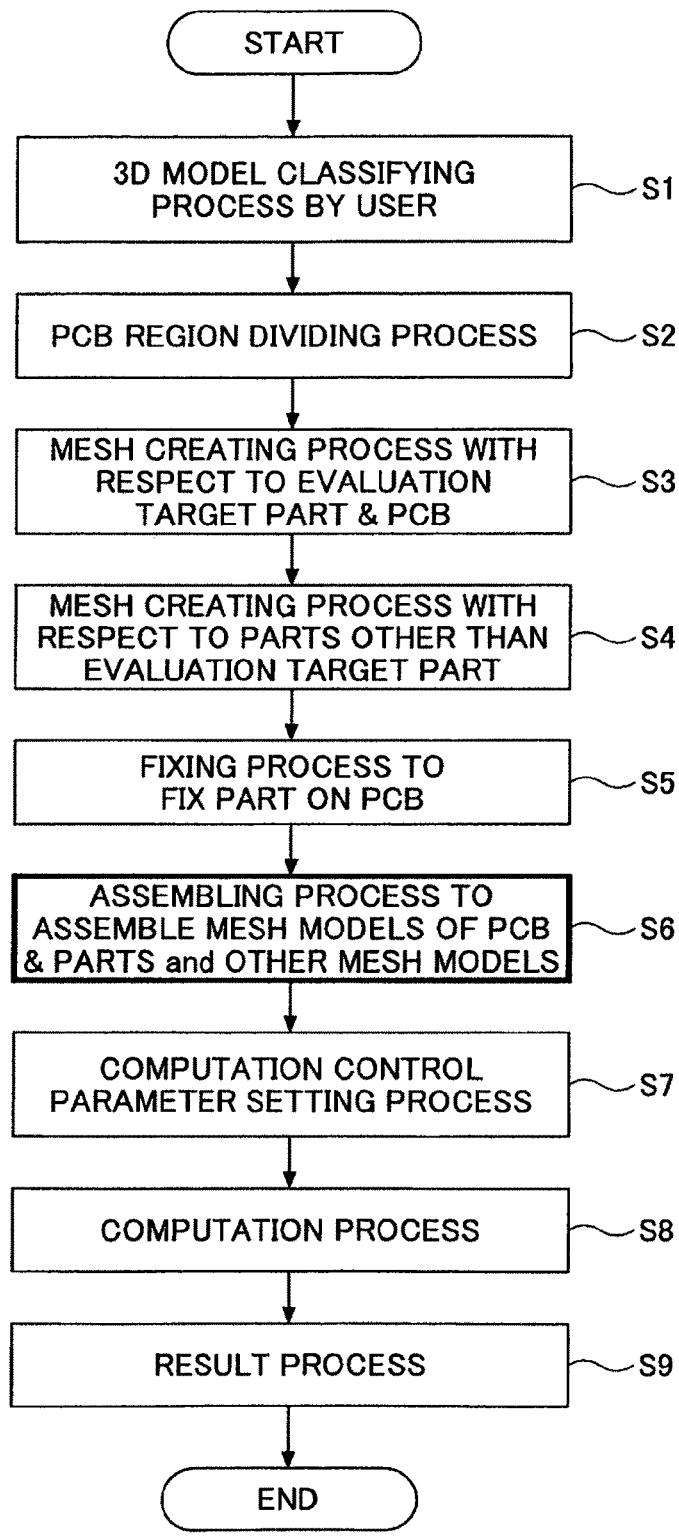
FIG. 3 is a flow chart for explaining a process of the analyzing model creating apparatus as a whole.

FIG. 3 is a flow chart for explaining a process of the analyzing model creating apparatus 21 as a whole. In a case where the analyzing model creating apparatus 21 is formed by the computer system, the analyzing model creating method causes the computer system to execute the steps shown in FIG. 3.

In FIG. 3, a step S1 carries out a 3D model classifying process with respect to the 3D model data read from the 3D model database 23, in response to an instruction input by the user from the input device 22, and the 3D model classifying process classifies the 3D model into the data of the PCB and the data of the part which is to be mounted on the PCB. A step S2 carries out a region dividing process which divides a region on the PCB based on the data of the PCB. A step S3 carries out a mesh creating process which divides an evaluation target part and the PCB into meshes, with respect to each region on the PCB. A step S4 carries out a mesh creating process which divides the parts other than the evaluation target part into meshes.

A step S5 carries out a fixing process which fixes each part on the PCB. A step S6 carries out an assembling process which assembles mesh models of the PCB and the parts and other mesh models, in response to data input by the user from the input device 22. A step S7 carries out a computation control parameter setting process which sets computation control parameters for evaluating the part bonding strength of the evaluation target part on the PCB, in response to data input by the user from the input device 22. A step S8 carries out a computation process which computes the part bonding strength of the evaluation target part on the PCB or, parameters capable evaluating the part bonding strength, based on the set computation control parameters. A step S9 carries out a result process which outputs, as an evaluation result, the computed part bonding strength or the computed parameters capable of evaluating the part bonding strength, and the evaluation result is displayed on the display unit 26, for example. The process ends after the step S9. The processes of the steps S1 through S9 are executed by the computer system (or processor), and the processes of the steps S2 through S5, S8 and S9 are automatically executed by the computer system (or processor).

Figure 4:
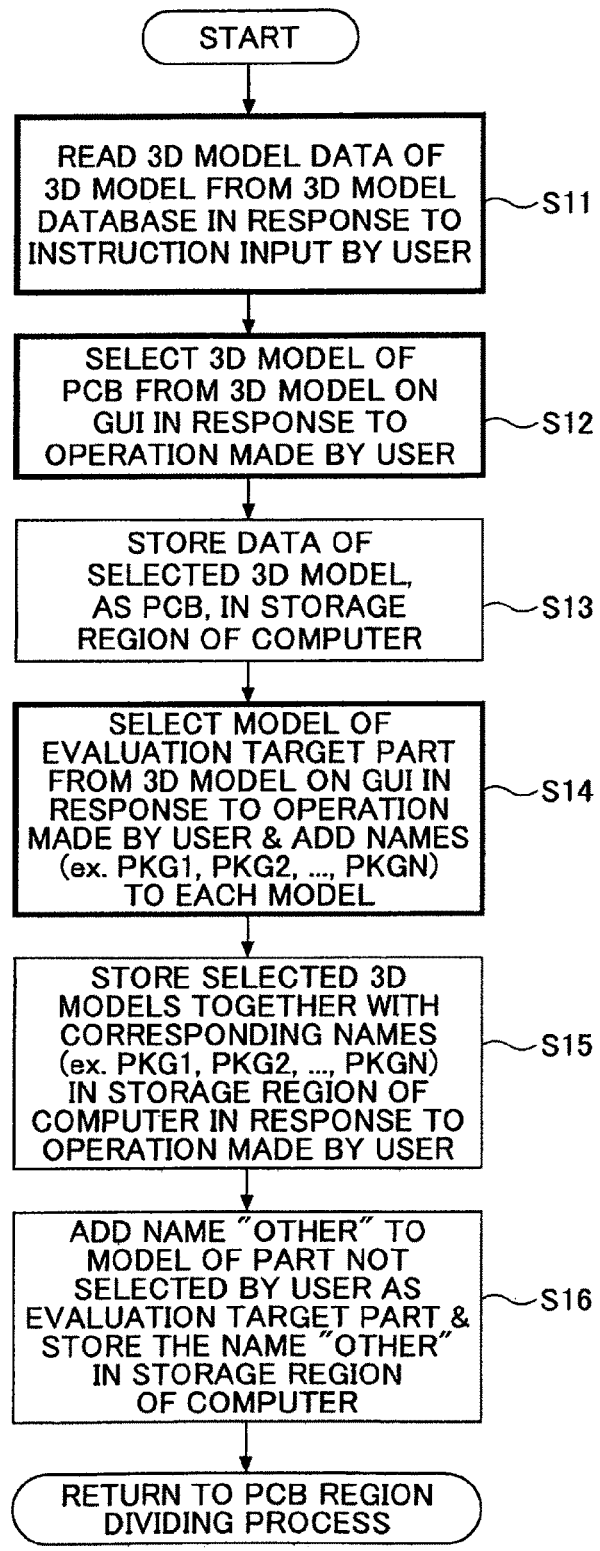
FIG. 4 is a flow chart for explaining a three-dimensional model data classifying process in more detail.
Figure 5:
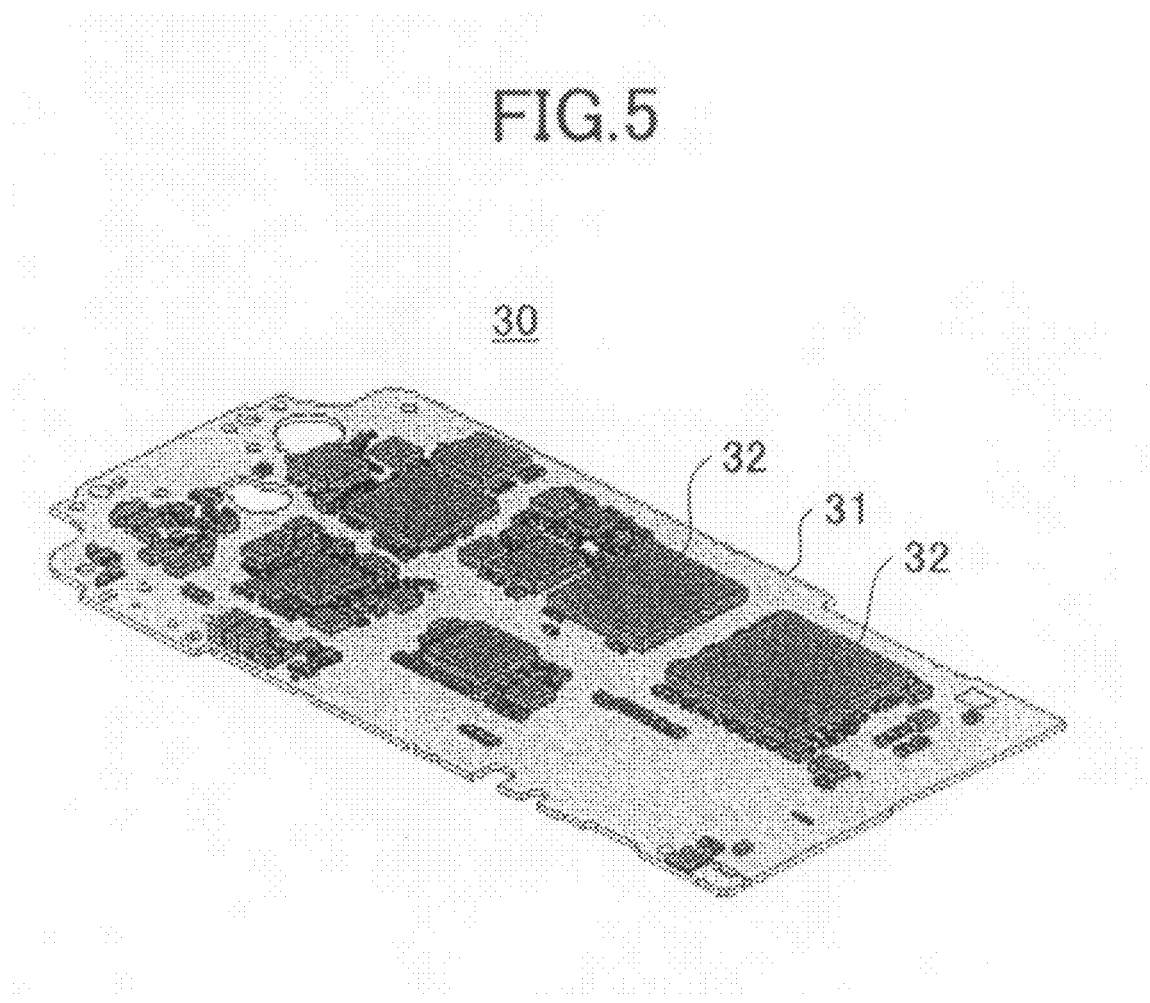
FIG. 5 is a perspective view showing a three-dimensional model.

FIG. 4 is a flow chart for explaining the 3D model data classifying process of the step S1 in more detail. In FIG. 4, a step S11 reads the 3D model data of a 3D model shown in FIG. 5 from the 3D model database 23, in response to an instruction input by the user from the input device 22, and displays the read 3D model data on the display unit 26. FIG. 5 is a perspective view showing the 3D model 30. The 3D model 30 includes a PCB 31, and a plurality of parts 32 provided on the PCB 31. A step S12 selects the 3D model of the PCB 31 from the 3D model 30 on the display screen of the display unit 26, that is, on a Graphic User Interface (GUI), in response to an operation made by the user from the input device 22. A step S13 stores (or saves) the data of the 3D model selected in the step S12, in a storage region within the storage unit 24, in response to an operation made by the user from the input device 22.

Figure 6:
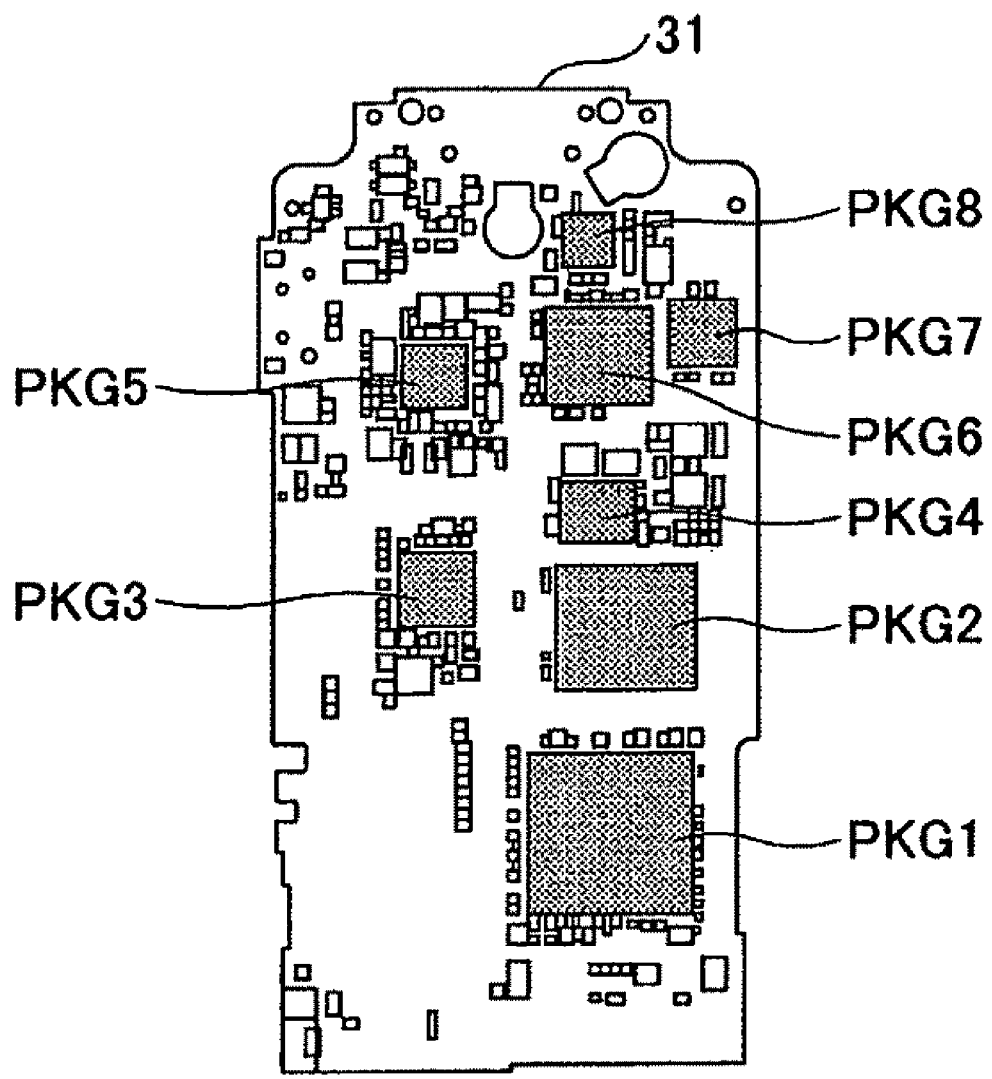
FIG. 6 is a plan view for explaining a selection of an evaluation target part.

A step S14 selects the 3D model of the evaluation target part 32 from the 3D model 30 on the display unit 26, that is, on the GUI, in response to an operation made by the user from the input device 22. In this particular case, for example, names PKG1, PKG2, . . . , PKGN (where N is a positive integer) are added to the 3D model of each of the evaluation target parts 32 as shown in FIG. 6. FIG. 6 is a plan view for explaining the selection of the evaluation target part. A step S15 stores (or saves) the selected 3D models together with the corresponding names PKG1, PKG2, . . . , PKGN added in the step S14 in a storage region within the storage unit 24, in response to an operation made by the user from the input device 22. A step S16 automatically adds a name such as OTHER, for example, to the 3D model of the part 32 which is not selected by the user as the evaluation target part 32, and automatically stores (or saves) the 3D model of this non-selected part 32 and the corresponding name OTHER in a storage region within the storage unit 24. After the step S16, the process returns to the step S2 shown in FIG. 3.

Figure 7:
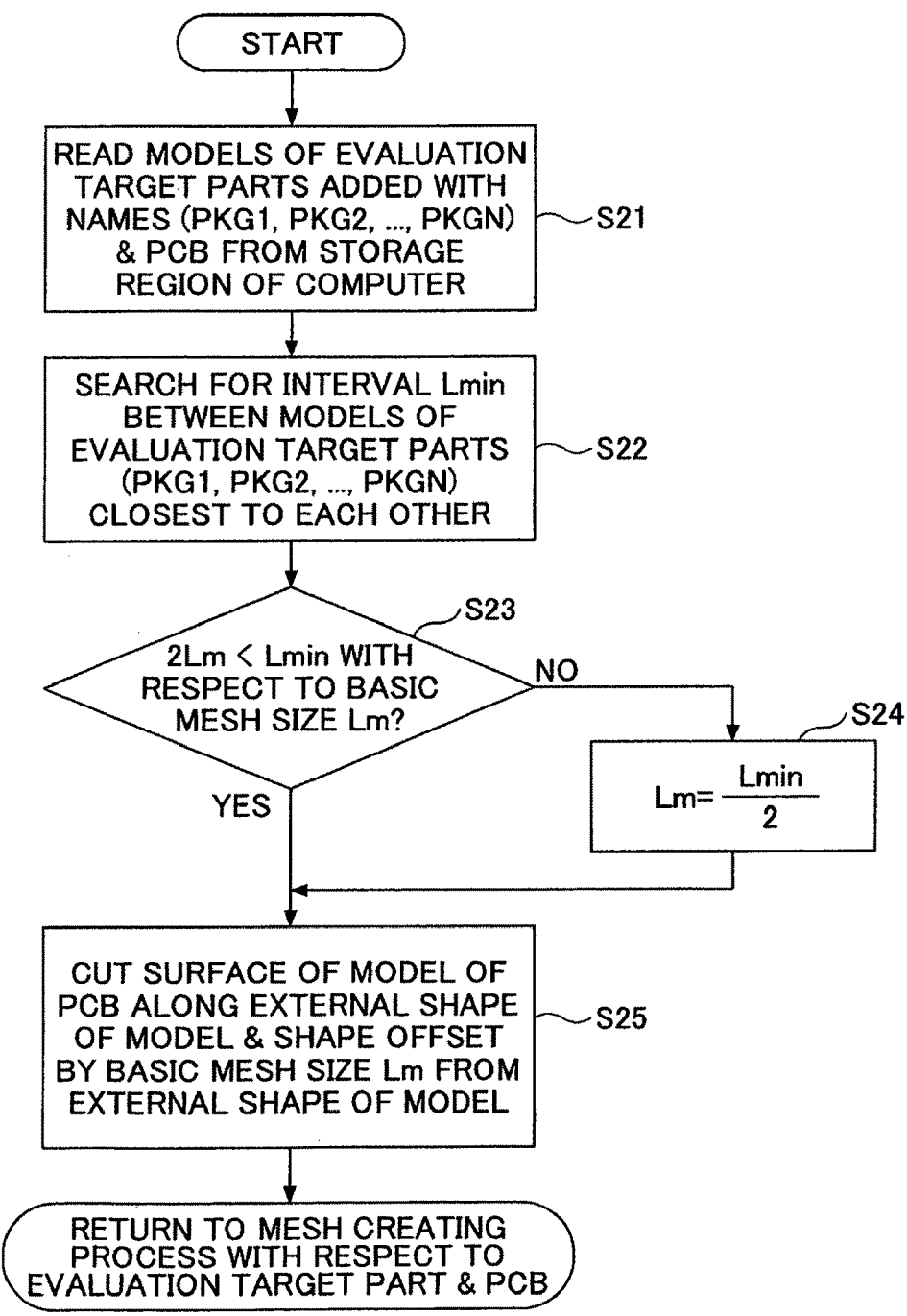
FIG. 7 is a flow chart for explaining a region dividing process in more detail.
Figure 8:
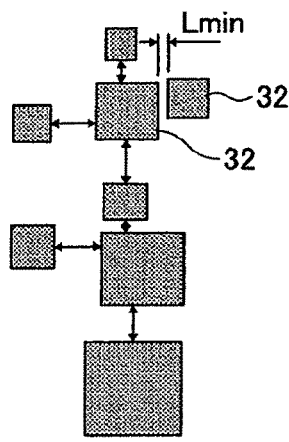
FIG. 8 is a diagram for explaining a minimum part interval.
Figure 9:
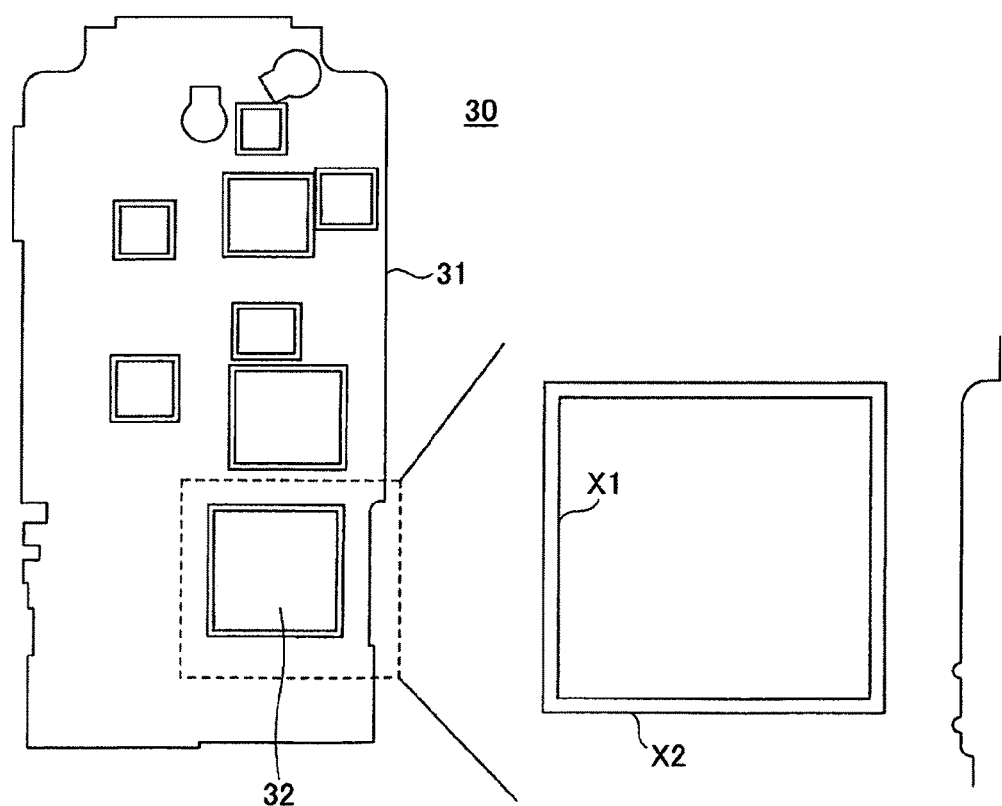
FIG. 9 is a diagram for explaining cutting of a surface of a PCB model depending on an external shape of the evaluation target part.

FIG. 7 is a flow chart for explaining the region dividing process of the step S2 in more detail. In FIG. 7, a step S21 reads the 3D models of each of the evaluation target parts 32 added with the names PKG1, PKG2, . . . , PKGN and the 3D model of the PCB 31, from the storage region within the storage unit 24. A step S22 searches for an interval (or distance) Lmin between the 3D models of the evaluation target parts 32 which are closest to each other among the 3D models of the evaluation target parts 32, as shown in FIG. 8. FIG. 8 is a diagram for explaining a minimum part interval. A step S23 decides whether or not 2Lm<Lmin stands with respect to a basic mesh size Lm. If the decision result in the step S23 is NO, a step S24 sets the basic mesh size Lm to Lm=Lmin/2. If the decision result in the step S23 is YES or, after the step S24, a step S25 cuts the surface of the 3D model of the PCB 31 along an external shape of the 3D model 30 and a shape which is offset by the basic mesh size Lm from the external shape of the 3D model 30, as indicated by a dotted line in FIG. 9, and the process returns to the step S3 shown in FIG. 3. FIG. 9 is a diagram for explaining the cutting of the surface of the PCB model depending on the external shape of the evaluation target part 32. In FIG. 9, the cut portion is indicated on the right-hand side on an enlarged scale. In FIG. 9, X1 denotes the external shape of the evaluation target part 32, and X2 denotes the external shape which is obtained by offsetting the external shape X2 by the basic mesh size Lm.

Figure 10:
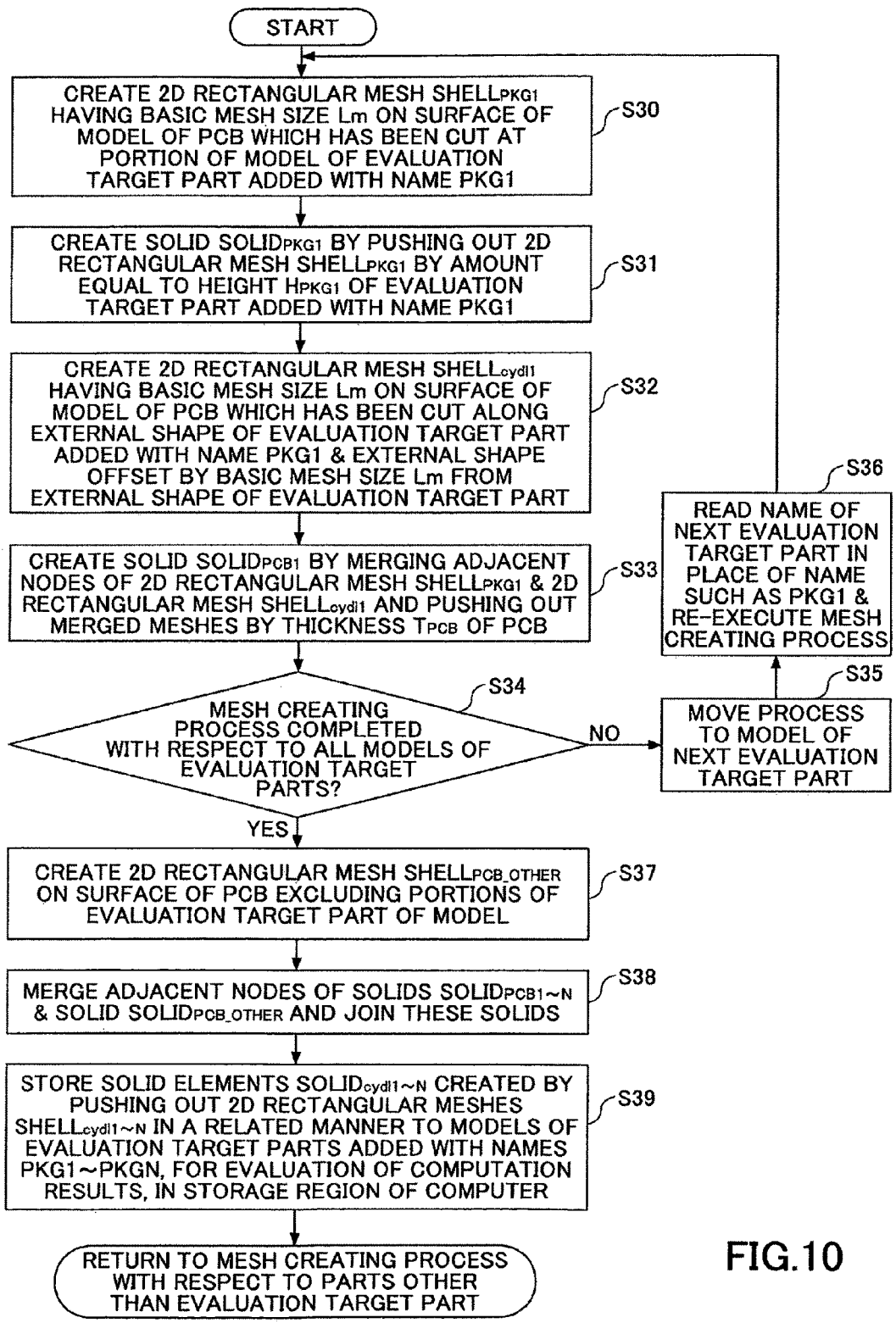
FIG. 10 is a flow chart for explaining a mesh creating process in more detail.
Figure 11:
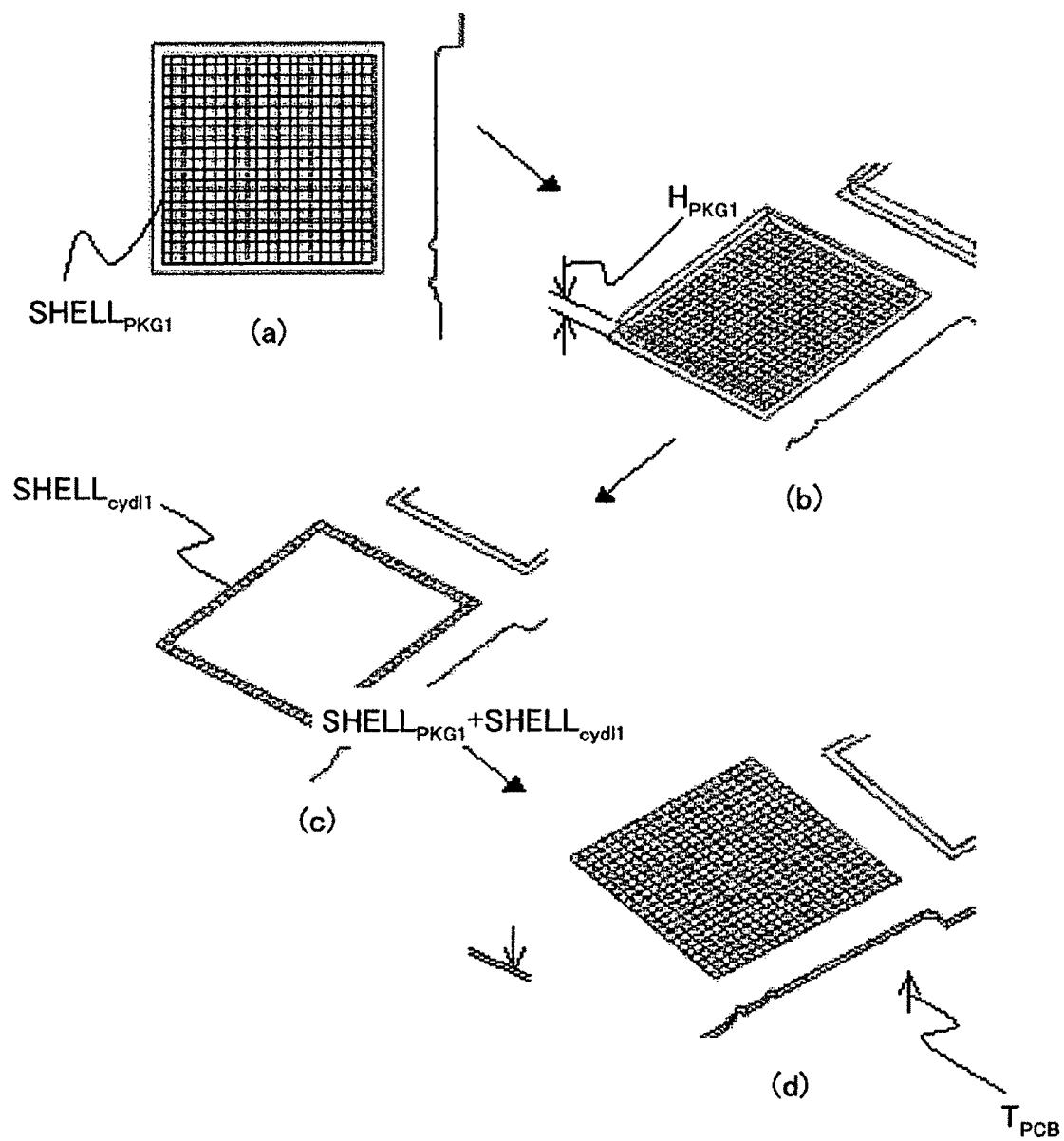
FIG. 11 is a diagram for explaining a mesh creating process with respect to the three-dimensional model of the evaluation target part.

FIG. 10 is a flow chart for explaining the mesh creating process of the step S3 in more detail. In FIG. 10, a step S30 creates a two-dimensional rectangular mesh $SHELL_{PKG1}$ having the basic mesh size Lm on the surface of the 3D model of the PCB 31 which has been cut at the portion of the 3D model of the evaluation target part 32 added with the name PKG1, as shown in FIG. 11(a). FIG. 11 is a diagram for explaining the mesh creating process with respect to the 3D model of the evaluation target part. A step 31 creates a solid $SOLID_{PKG1}$ by pushing out the two-dimensional rectangular mesh $SHELL_{PKG1}$ by an amount equal to a height $H_{PKG1}$ of the evaluation target part 32 which is added with the name PKG1, as shown in FIG. 11(b). A step S32 creates a two-dimensional rectangular mesh $SHELL_{cydl1}$ having the basic mesh size Lm on the surface of the 3D model of the PCB 31 which has been cut along the external shape of the evaluation target part 32 added with the name PKG1 and the external shape which is offset by the basic mesh size Lm from the external shape of this evaluation target part 32, as shown in FIG. 11(c). A step S33 creates a solid $SOLID_{PCB1}$ by merging adjacent nodes of the two-dimensional rectangular mesh $SHELL_{PKG1}$ and the two-dimensional rectangular mesh $SHELL_{cydl1}$, and pushing out the merged meshes by a thickness $T_{PCB}$ of the PCB 31, as shown in FIG. 11(d). A step S34 decides whether or not the mesh creating process has been completed with respect to all of the 3D models of the evaluation target parts 32. The process advances to a step S35 if the decision result in the step S34 is NO, and the process advances to a step S37 if the decision result in the step S34 is YES.

The step S35 moves the process to the 3D model of the next evaluation target part 32. In addition, a step S36 reads the name of the next evaluation target part 32 in place of the name such as PKG1 of the evaluation target part 32, and the process returns to the step S30 in order to re-execute the mesh creating process.

Figure 12:
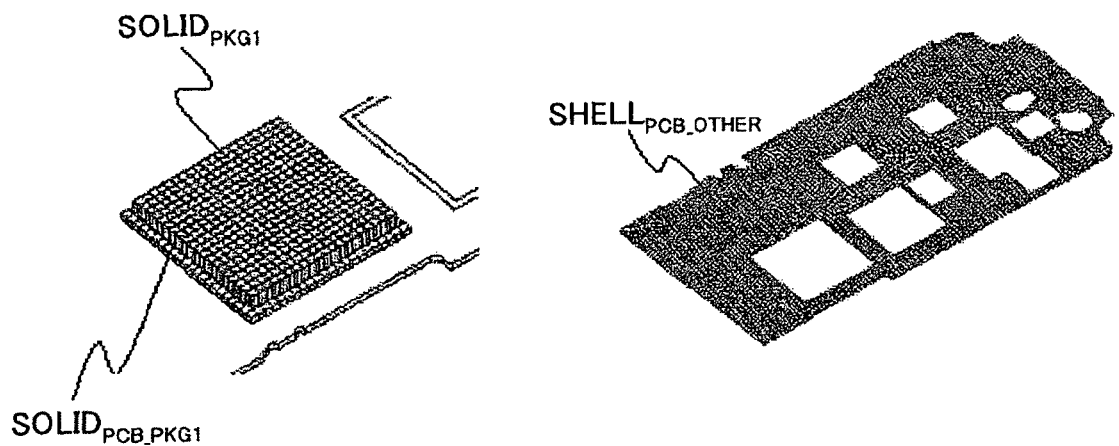
FIG. 12 is a diagram showing a two-dimensional mesh of a remaining portion of a PCB.
Figure 13:
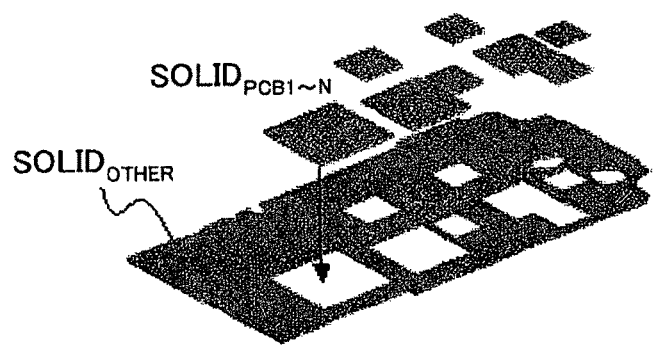
FIG. 13 is a diagram for explaining merging of solid elements of the evaluation portion and the remaining portion.
Figure 14:
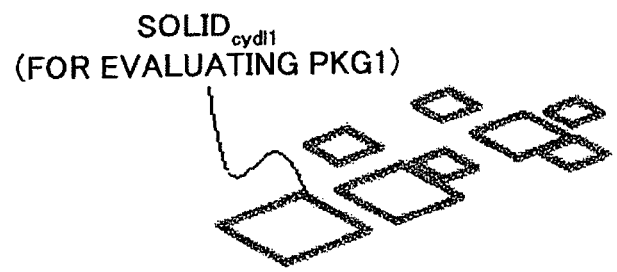
FIG. 14 is a diagram showing the element for result evaluation.

On the other hand, the step S37 creates a two-dimensional rectangular mesh $SHELL_{PCB\_OTHER}$ on the surface of the PCB 31 excluding the portions of the evaluation target part 32 of the 3D model 30, as shown in FIG. 12. FIG. 12 is a diagram showing the two-dimensional mesh of the remaining portion of the PCB. A step S38 merges the adjacent nodes of the solids $SOLID_{PCB1\sim N}$ and the solid $SOLID_{PCB\_OTHER}$ and joins these solids, as shown in FIG. 13. FIG. 13 is a diagram for explaining the merging of solid elements of the evaluation portion and the remaining portion. A step S39 stores (or saves) solid elements $SOLID_{cydl1\sim N}$ which are created by pushing out the two-dimensional rectangular meshes $SHELL_{cydl1\sim N}$, in a related manner to the 3D models of the evaluation target parts 32 added with the names PKG1 through PKGN, for evaluation of computation results, in a storage region within the storage unit 24, as shown in FIG. 14. After the step S39, the process returns to the step S4 shown in FIG. 3. FIG. 14 is a diagram showing the element for result evaluation.

Figure 15:
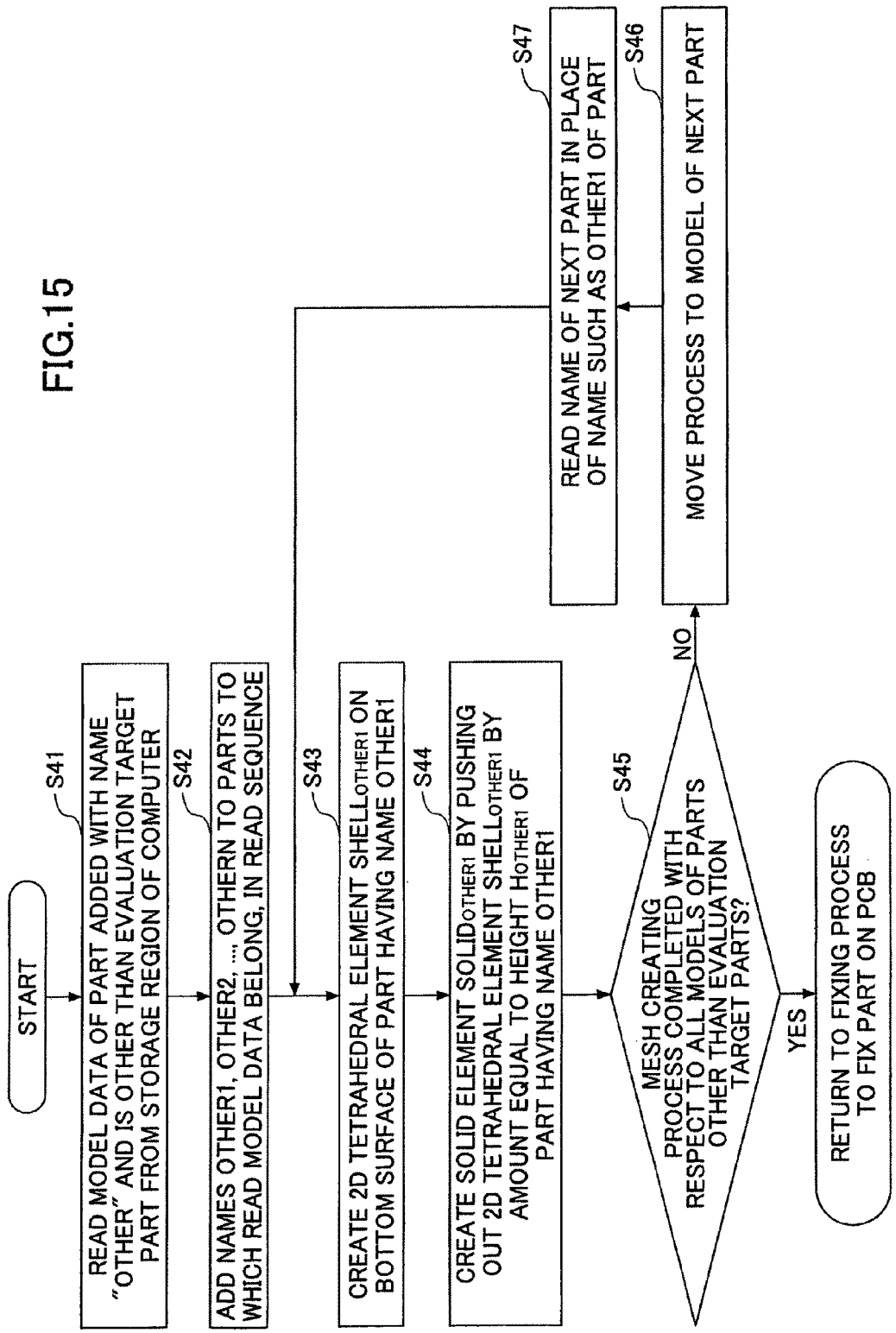
FIG. 15 is a flow chart for explaining the mesh creating process in more detail.
Figure 16:
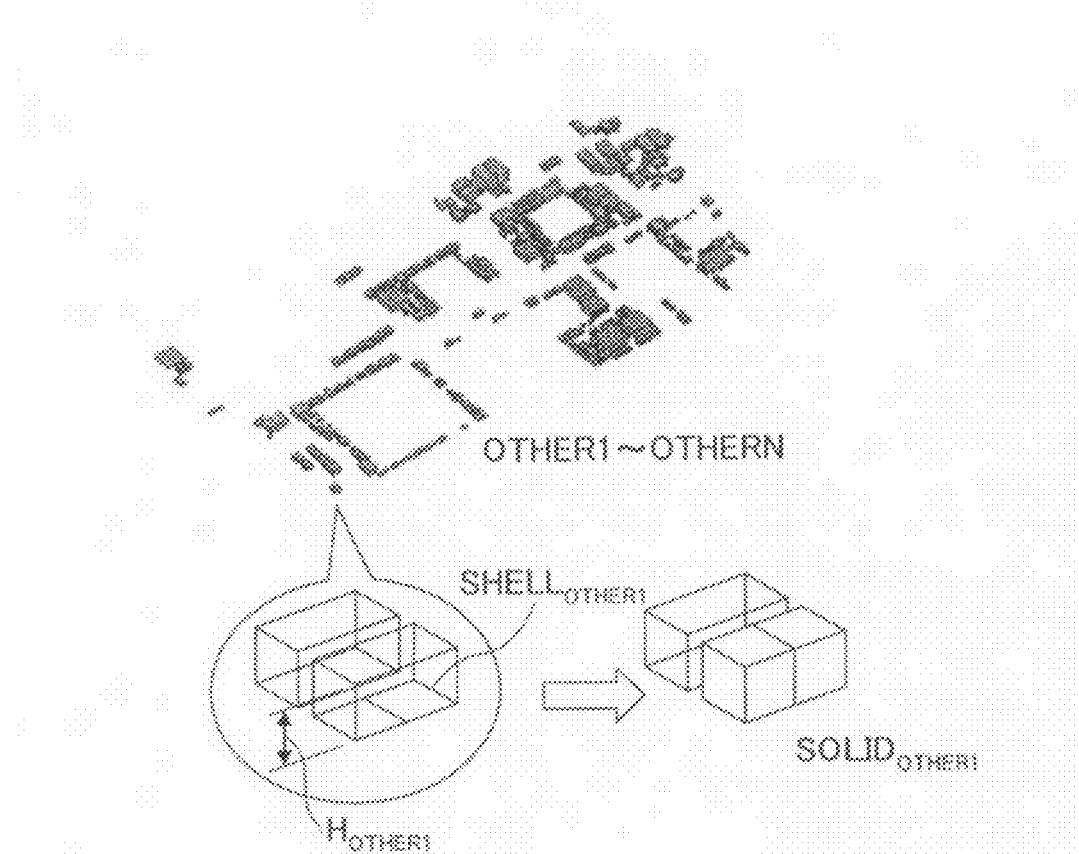
FIG. 16 is a diagram for explaining a mesh generation for a part other than the evaluation target part.

FIG. 15 is a flow chart for explaining the mesh creating process of the step S4 in more detail. In FIG. 15, a step S41 reads the 3D model data of the part 32 which is added with the name OTHER and is other than the evaluation target part 32, from the storage region within the storage unit 24. A step S42 adds names OTHER1, OTHER2, . . . , OTHERN to the parts 32 to which the read 3D model data belong, in the read sequence. A step S43 creates a two-dimensional tetrahedral element $SHELL_{OTHER1}$ on a bottom surface of the part 32 having the name OTHER1, as shown in FIG. 16(a). FIG. 16 is a diagram for explaining a mesh generation for the part other than the evaluation target part. A step S44 creates a solid element $SOLID_{OTHER1}$ by pushing out the two-dimensional tetrahedral element $SHELL_{OTHER1}$ by an amount equal to a height $H_{OTHER1}$ of the part 32 having the name OTHER1, as shown in FIG. 16(b).

Figure 17:
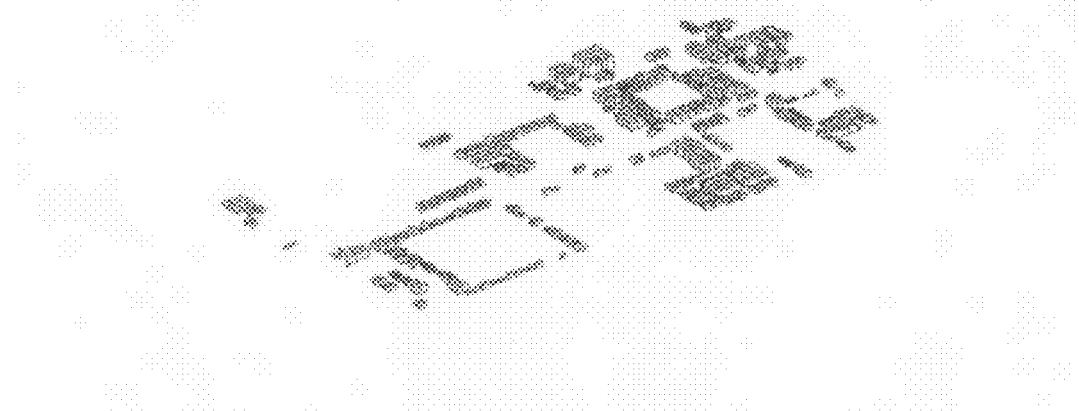
FIG. 17 is a diagram showing meshes of the parts other than the evaluation target parts.

A step S45 decides whether or not the mesh creating process has been completed with respect to all of the 3D models of the parts 32 other than the evaluation target parts 32. FIG. 17 is a diagram showing the meshes of the parts other than the evaluation target parts. If the decision result in the step S45 is NO, a step S46 moves the process to the 3D model of the next part 32. In addition, a step S47 reads the name of the next part 32 in place of the name such as OTHER1 of the part 32, and the process returns to the step S43 in order to re-execute the mesh creating process. On the other hand, if the decision result in the step S45 is YES, the process ends and the process returns to the step S5 shown in FIG. 3.

Figure 18:
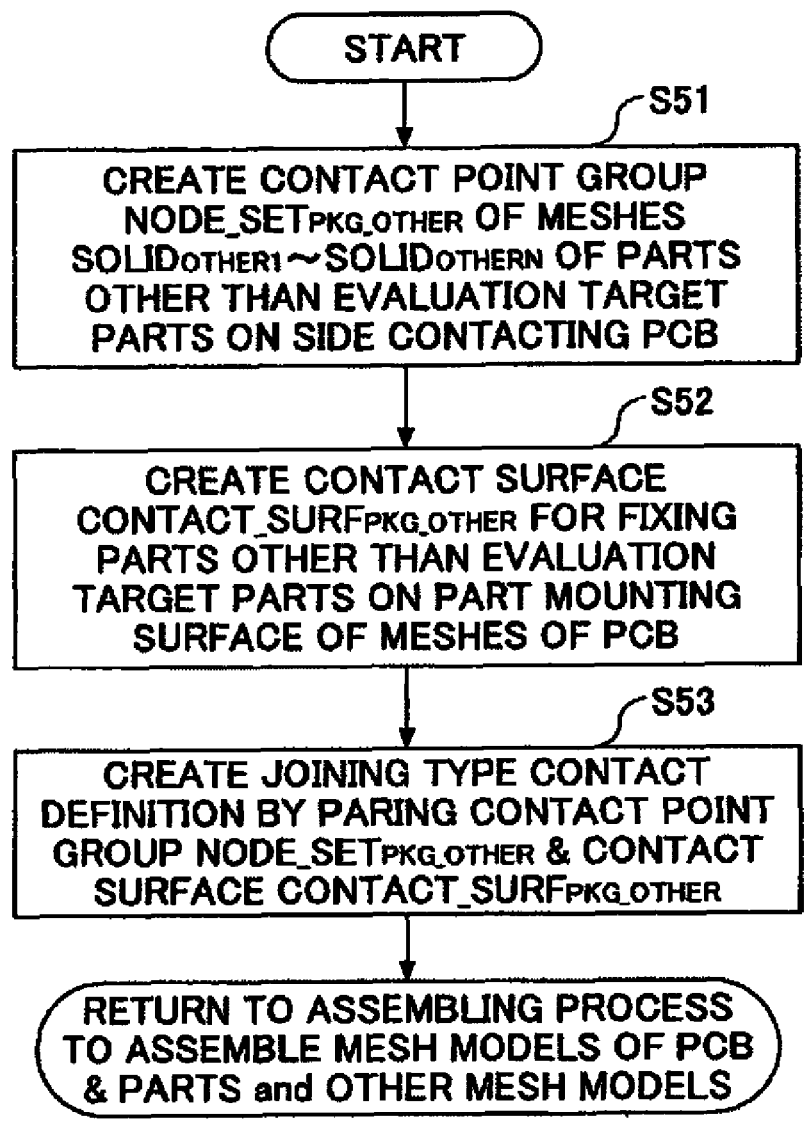
FIG. 18 is a flow chart for explaining a fixing process in more detail.
Figure 19:
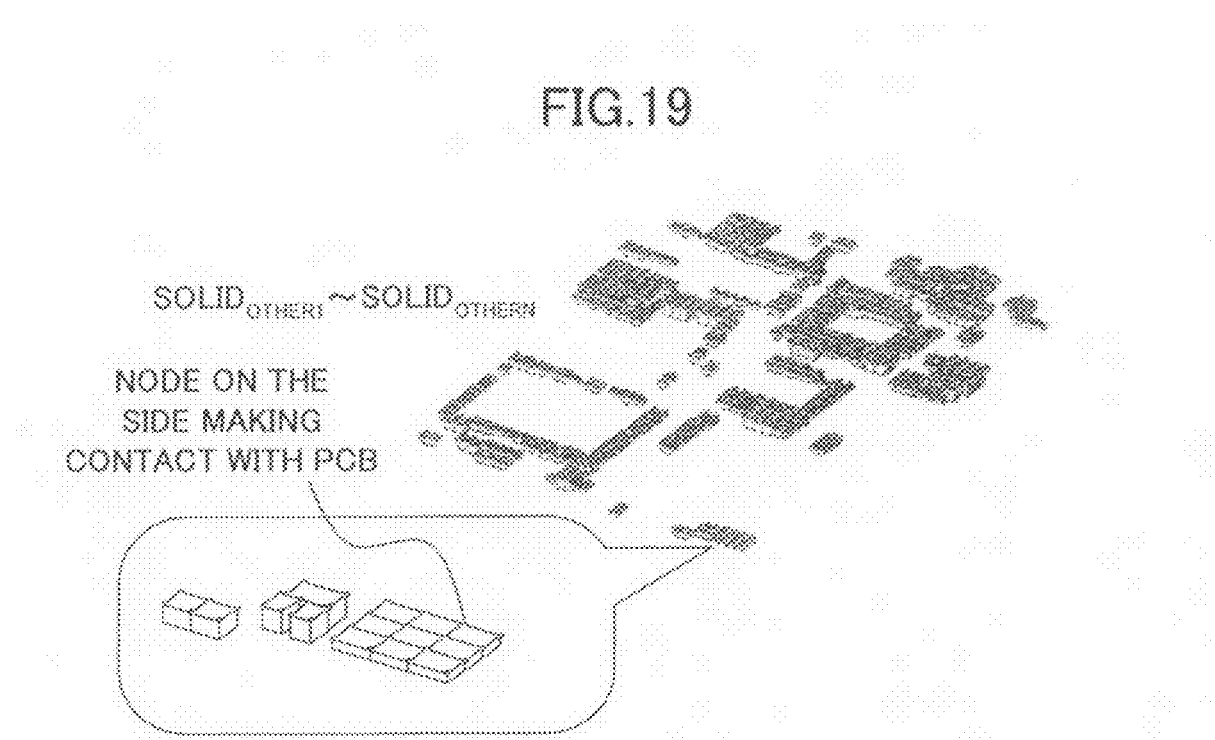
FIG. 19 is a diagram for explaining a contact point group of the parts other than the evaluation target parts on the side making contact with the PCB.
Figure 20:
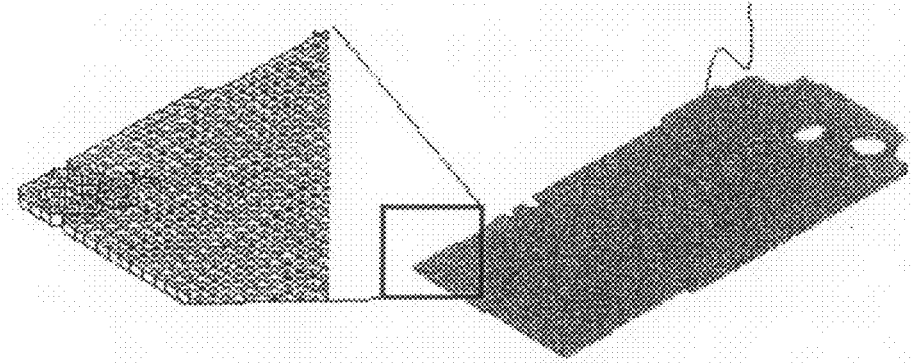
FIG. 20 is a diagram showing a contact surface created on a part mounting surface of the meshes of the PCB.

FIG. 18 is a flow chart for explaining the fixing process of the step S5 in more detail. In FIG. 18, a step S51 creates a contact point group $NODE\_SET_{PKG\_OTHER}$ of the meshes $SOLID_{OTHER1}$ through $SOLID_{OTHERN}$ of the parts 32 other than the evaluation target parts 32, on the side contacting the PCB 31, as shown in FIG. 19. FIG. 19 is a diagram for explaining the contact point group of the parts other than the evaluation target parts on the side making contact with the PCB. A step S52 creates a contact surface $CONTACT\_SURF_{PKG\_OTHER}$ for fixing the parts 32 other than the evaluation target parts 32, on the part mounting surface of the meshes of the PCB 31, as shown in FIG. 20. FIG. 20 is a diagram showing the contact surface created on the part mounting surface of the meshes of the PCB. A step S53 creates a joining type contact definition by pairing the contact point group $NODE\_SET_{PKG\_OTHER}$ and the contact surface $CONTACT\_SURF_{PKG\_OTHER}$, the process ends and the process returns to the step S6 shown in FIG. 3.

The program causes the processor to execute the processes of the procedures described above in order to realize the functions of an interval acquiring part (or interval acquiring means) for acquiring intervals of a plurality of parts that are mounted on a PCB for an electronic equipment from design data of the PCB, a comparing part (or comparing means) for comparing a minimum part interval between the parts and a first mesh size which is preset, a computing part (or computing means) for computing a value which is one-half the minimum part interval between the parts as a second mesh size if the minimum part interval between the parts is less than two times the first mesh size, and a generating part (or generating means) for generating an analyzing model of the PCB based on the second mesh size. The generating part may generate a stress analyzing region on the analyzing model in the periphery of the part using the second mesh size a reference. Accordingly, it is possible to form the analyzing model creating apparatus 21 having the interval acquiring part (or interval acquiring means), the comparing part (or comparing means), the computing part (or computing means), and the generating part (or generating means).

Because the part models on the PCB mostly have rectangular shapes, the mounting surface of the part model is always included in the surface or plane of the PCB model. The two-dimensional mesh is created by searching the bottom surface, by searching the surface included in the surface (or plane) of the PCB from the surfaces forming the part model. The solid mesh of the part is created automatically by pushing out the two-dimensional mesh that is created by an amount equal to the height of the surface perpendicular to the bottom surface. Conventionally, the user selects the bottom surface of the part and pushes out the two-dimensional mesh by an amount equal to the height of the part, in order to create the solid mesh for each part. On the other hand, the present invention utilizes the fact that the mounting surface of the part is always included in the mounting surface of the PCB, and it is possible to automatically create the meshes of a plurality of parts without requiring operations to be performed by the user.

The meshes of the evaluation target part and the PCB are joined at the common nodes, and the evaluation target elements having the basic mesh size are arranged in the periphery of the evaluation target part, so that the positional relationship of the evaluation target part and the evaluation target elements of the PCB meshes is maintained constant. Consequently, by creating the mesh model using the rule which requires joining of the evaluation target part and the meshes of the PCB at the common nodes and the arranging of the evaluation target elements having the basic mesh size in the periphery of the evaluation target part, it is possible to accurately evaluate the part bonding strength in cases where the part mounting position is changed or the apparatus to which the parts are mounted is changed.

In order to arrange the evaluation target elements in the periphery of the evaluation target part regardless of the part layout of the evaluation target parts, the intervals of the evaluation target parts are evaluated, and the basic mesh size is set to one-half the minimum part interval if the minimum part interval is less than two times the basic mesh size which is preset. As a result, it is possible to arrange the evaluation target elements in the periphery of the evaluation target part regardless of the part layout of the evaluation target parts. Furthermore, even in a case where the part interval of the evaluation target parts is extremely short locally, it is possible to correct (or modify) the basic mesh size based on this part interval and positively arrange the evaluation target elements in the periphery of the evaluation target part.

By using the FEM model creating apparatus of the embodiment described above, the user simply needs to make the system read the 3D model of the target PCB, and make the system recognize the PCB and the evaluation target part, in order to automatically create the FEM model regardless of the number of parts that are mounted on the PCB. The efficiency with which the FEM model is created can be improved by approximately ten or more times compared to the conventional method.

By arranging the evaluation target elements having the basic mesh size in the periphery of the evaluation target part, it may be expected that the relative accuracy when the mounting position of the part is changed is improved by approximately 20% compared to the conventional method.

This application claims the benefit of a Japanese Patent Application No. 2007-323689 filed Dec. 14, 2007, in the Japanese Patent Office, the disclosure of which is hereby incorporated by reference.

Further, the present invention is not limited to these embodiments, but various variations and modifications may be made without departing from the scope of the present invention.

What is claimed is:

1. An analyzing model creating apparatus comprising:
a storage unit configured to store design data; and
a processor,
said processor comprising:
an interval acquiring part configured to acquire intervals of a plurality of parts that are mounted on a printed circuit board for an electronic equipment, from design data of the printed circuit board read from the storage unit;

a comparing part configured to compare a minimum part interval between the parts and a first mesh size which is preset;

a computing part configured to compute a value which is one-half the minimum part interval between the parts as a second mesh size when the minimum part interval between the parts is less than two times the first mesh size; and a generating part configured to generate an analyzing model of the printed circuit board for evaluating a part bonding strength of an evaluation target part on the printed circuit board, based on the second mesh size.

2. The analyzing model creating apparatus as claimed in claim 1, wherein the generating part generates a stress analyzing region on the analyzing model in a periphery of a part using the second mesh size as a reference.

3. The analyzing model creating apparatus as claimed in claim 2, wherein the generating part generates the analyzing model using the first mesh size as a reference at regions other than the stress analyzing region.

4. The analyzing model creating apparatus as claimed in claim 1, wherein the generating part changes positions of each of the parts of the analyzing model depending on a height of each of the parts.

5. The analyzing model creating apparatus as claimed in claim 1, wherein the processor further comprises:

a part configured to compute the part bonding strength of the evaluation target part on the printed circuit board from the analyzing model; and an output part configured to output an evaluation result of the analyzing model, including the part bonding strength of the evaluation target part on the printed circuit board.

6. A non-transitory computer-readable storage medium which stores a program which, when executed by a computer, causes the computer to perform a process comprising:

an interval acquiring procedure causing the computer to acquire intervals of a plurality of parts that are mounted on a printed circuit board for an electronic equipment, from design data of the printed circuit board;

a comparing procedure causing the computer to compare a minimum part interval between the parts and a first mesh size which is preset;

a computing procedure causing the computer to compete a value which is one-half the minimum part interval between the parts as a second mesh size when the minimum part interval between the parts is less than two times the first mesh size; and a generating procedure causing the computer to generate an analyzing model of the printed circuit board for evaluating a part bonding strength of an evaluation target part on the printed circuit board, based on the second mesh size.

7. The non-transitory computer-readable storage medium as claimed in claim 6, wherein the generating procedure generates a stress analyzing region on the analyzing model in a periphery of a part using the second mesh size as a reference.

8. The non-transitory computer-readable storage medium as claimed in claim 7, wherein the generating procedure generates the analyzing model using the first mesh size as a reference at regions other than the stress analyzing region.

9. The non-transitory computer-readable storage medium as claimed in claim 6, wherein the generating procedure changes positions of each of the parts of the analyzing model depending on a height of each of the parts.

10. The non-transitory computer-readable storage medium as claimed in claim 6, wherein the process further comprises:

a procedure causing the computer to compute the part bonding strength of the evaluation target part on the printed circuit board from the analyzing model; and an output procedure causing the computer to output an evaluation result of the analyzing model, including the part bonding strength of the evaluation target part on the printed circuit board.

11. An analyzing model creating method to be implemented in a computer for causing the computer to execute a process comprising:

acquiring intervals of a plurality of parts that are mounted on a printed circuit board for an electronic equipment, from design data of the printed circuit board;

comparing a minimum part interval between the parts and a first mesh size which is preset;

computing a value which is one-half the minimum part interval between the parts as a second mesh size when the minimum part interval between the parts is less than two times the first mesh size; and generating an analyzing model of the printed circuit board for evaluating a part bonding strength of an evaluation target part on the printed circuit board, based on the second mesh size.

12. The analyzing model creating method as claimed in claim 11, wherein the generating generates a stress analyzing region on the analyzing model in a periphery of a part using the second mesh size as a reference.

13. The analyzing model creating method as claimed in claim 12, wherein the generating generates the analyzing model using the first mesh size as a reference at regions other than the stress analyzing region.

14. The analyzing model creating method as claimed in claim 10, wherein the generating changes positions of each of the parts of the analyzing model depending on a height of each of the parts.

15. The analyzing model creating method as claimed in claim 11, wherein the process further comprises:

computing the part bonding strength of the evaluation target part on the printed circuit board from the analyzing model; and outputting an evaluation result of the analyzing model, including the part bonding strength of the evaluation target part on the printed circuit board.

* * * * *

UNITED STATES PATENT AND TRADEMARK OFFICE
CERTIFICATE OF CORRECTION

PATENT NO. : 8,073,660 B2  Page 1 of 1
APPLICATION NO. : 12/222728
DATED : December 6, 2011
INVENTOR(S) : Shigeo Ishikawa et al.

It is certified that error appears in the above-identified patent and that said Letters Patent is hereby corrected as shown below:

On the Title page:

Item (56) References Cited in Column 2 (Other Publications), After "European Search report dated Aug. 19, 2009 and issued in corresponding European Patent Application 08162436.3." delete "European Search report dated Aug. 19, 2009 and issued in corresponding European Patent Application 08162436.3.".

In the Claims:

Column 9, Line 43, In Claim 6, delete "compete" and insert -- compute --, therefor.

Signed and Sealed this
Fourth Day of September, 2012

David J. Kappos
*Director of the United States Patent and Trademark Office*